United States Patent [19]

Hearn

[11] Patent Number: 5,594,351
[45] Date of Patent: Jan. 14, 1997

[54] APPARATUS FOR USE IN DETERMINING SURFACE CONDUCTIVITY AT MICROWAVE FREQUENCIES

[75] Inventor: Chase P. Hearn, Williamsburg, Va.

[73] Assignee: The United States of America as represented by the Administrator of the National Aeronautics and Space Administration, Washington, D.C.

[21] Appl. No.: 448,286

[22] Filed: May 23, 1995

[51] Int. Cl.$^6$ ..................................................... F26B 3/34
[52] U.S. Cl. .......................................... 324/637; 324/632
[58] Field of Search ...................................... 324/632, 633, 324/634, 635, 636, 637, 638, 639, 642, 645, 646

[56] References Cited

U.S. PATENT DOCUMENTS

| | | | |
|---|---|---|---|
| 3,458,808 | 7/1969 | Agdur ........................................ | 324/633 |
| 3,946,308 | 3/1976 | Miura et al. .............................. | 324/636 |
| 4,890,054 | 12/1989 | Maeno et al. ............................ | 324/636 |
| 5,083,088 | 1/1992 | Bereskin ................................... | 324/642 |
| 5,500,599 | 3/1996 | Stange ....................................... | 324/632 |
| 5,506,497 | 4/1996 | Klein et al. .............................. | 324/636 |

*Primary Examiner*—Louis M. Arana
*Attorney, Agent, or Firm*—Kimberly A. Chasteen

[57] ABSTRACT

An apparatus is provided for use in determining surface conductivity of a flat or shaped conductive material at microwave frequencies. A plate has an electrically conductive surface with first and second holes passing through the plate. An electrically conductive material under test (MUT) is maintained in a spaced apart relationship with the electrically conductive surface of the plate by one or more non-conductive spacers. A first coupling loop is electrically shielded within the first hole while a second coupling loop is electrically shielded within the second hole. A dielectric resonator element is positioned between the first and second coupling loops, while also being positioned closer to the MUT than the electrically conductive surface of the plate. Microwave energy at an operating frequency f is supplied from a signal source to the first coupling loop while microwave energy received at the second coupling loop is measured. The apparatus is capable of measuring the Q-factor of the dielectric resonator situated in the "cavity" existing between the electrically conductive surface of the plate and the MUT. Surface conductivity of the electrically conductive surface can be determined via interpolation using: 1) the measured Q-factor with the electrically conductive surface in place, and 2) the measured Q-factor when the MUT is replaced with reference standards having known surface conductivities.

16 Claims, 2 Drawing Sheets

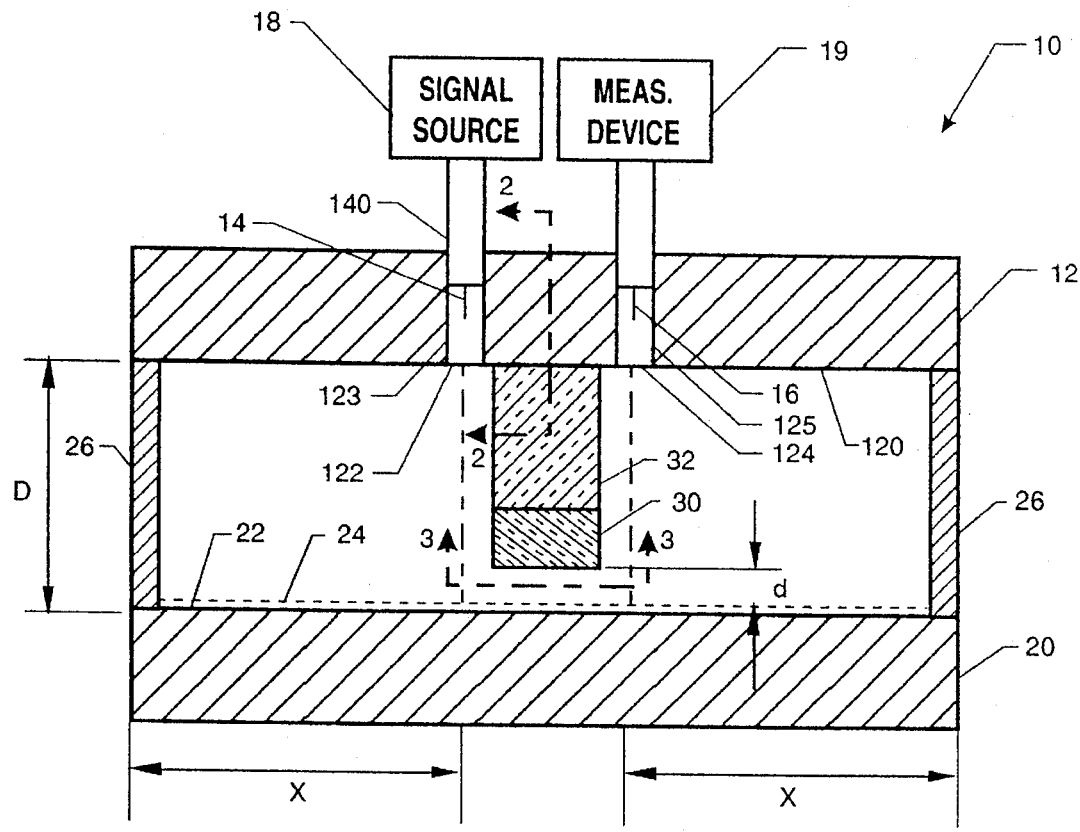
FIG. 1
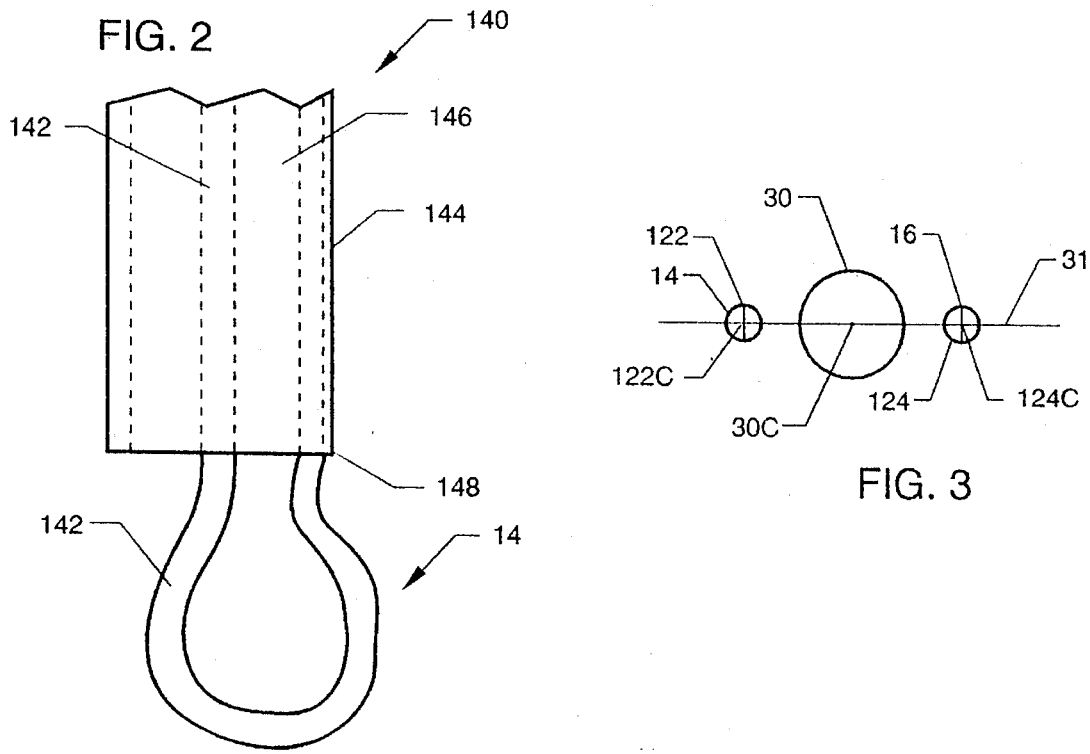
FIG. 2
FIG. 3

APPARATUS FOR USE IN DETERMINING SURFACE CONDUCTIVITY AT MICROWAVE FREQUENCIES

ORIGIN OF THE INVENTION

The invention described herein was made by an employee of the United States Government and may be manufactured and used by or for the Government for governmental purposes without the payment of any royalties thereon or therefor.

BACKGROUND OF THE INVENTION

1. Field of the Invention

This invention relates to determining electrical characteristics of conductive materials. More specifically, the invention is an apparatus that is useful in determining surface conductivity of materials at microwave frequencies.

2. Description of the Related Art

The determination of surface conductivity at microwave frequencies is important for evaluating, for example, conductive mesh materials which have been used on parabolic antennas. Current techniques used for determining surface conductivity at microwave frequencies include radiometric, loaded waveguide and resonant cavity techniques. Radiometric methods are most appropriate for measuring the radiation emitted by a lossy conductor. Further, this technique requires elaborate measurement systems and precise calibration using thermal standards. Adapting loaded waveguide or resonant cavity techniques for evaluation of a conductive mesh requires considerable fixture modification.

SUMMARY OF THE INVENTION

Accordingly, it is an object of the present invention to provide a simple technique for determining surface conductivity of a flat or shaped conductive material at microwave frequencies.

Another object of the present invention is to provide an apparatus for use in determining surface conductivity of a conductive mesh.

Other objects and advantages of the present invention will become more obvious hereinafter in the specification and drawings.

In accordance with the present invention, an apparatus is provided for use in determining surface conductivity of a flat or shaped conductive material at microwave frequencies. A first plate, having an electrically conductive surface, has first and second holes passing through the electrically conductive surface and into or through the first plate. A second plate supporting an electrically conductive material under test (MUT) is maintained in a spaced apart relationship with the first plate by one or more non-conductive spacers. A first coupling loop or coil is electrically shielded within the first hole while a second coupling loop is electrically shielded within the second hole. A dielectric resonator is positioned between the first and second coupling loops while also being positioned closer to the MUT than the electrically conductive surface of the first plate. Microwave energy at an operating frequency f is supplied from a signal source to the dielectric resonator via the first coupling loop. Microwave energy emanating from the dielectric resonator is received at the second coupling loop and measured by an energy measurement device connected to the second coupling loop.

The apparatus is capable of measuring the Q-factor of the dielectric resonator situated in the "cavity" existing between the electrically conductive surface of the first plate and the MUT. Briefly, surface conductivity of the MUT can be determined by comparing: 1) the measured Q-factor with the MUT in place, and 2) the measured Q-factor when the MUT is replaced with reference standards having known surface conductivities. In particular, the reference standards are chosen to have surface conductivities that are both greater than and less than that expected of the MUT. Thus, the surface conductivity of the MUT can be interpolated based on the measured Q-factors.

BRIEF DESCRIPTION OF THE DRAWINGS

FIG. 1 is, in part, a schematic view of the present invention and, in part, a side cross-sectional view of the present invention;

FIG. 2 is a side view of a coupling loop used in the present invention as taken along line 2—2 of FIG. 1;

FIG. 3 is a plan view taken along line 3—3 of FIG. 1 to show the orientation of the coupling loops to the dielectric resonator;

DETAILED DESCRIPTION OF THE INVENTION

Figure 4:
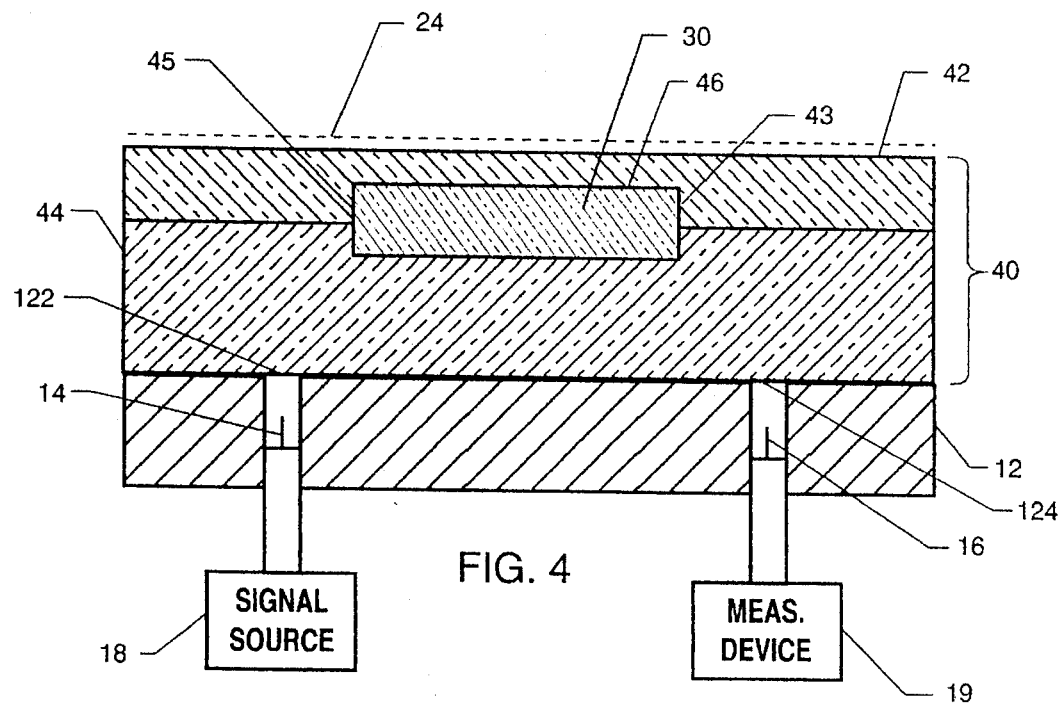
FIG. 4 is a side, cross-sectional view of an alternative embodiment in which a foam box serves as the positioner of the dielectric resonator and as a cavity spacer.

Referring now to the drawings, and more particularly to FIG. 1, an embodiment of the apparatus of the present invention is shown and referenced generally by the numeral 10. As will be understood by one skilled in the art from the following description, the present invention is useful for evaluating planar or non-planar, i.e., shaped, conductive material surfaces at microwave frequencies. The present invention is particularly useful for evaluating flat conductive materials, conductive materials that are flexible (e.g., conductive mesh) such that they can be formed on or supported by a planar surface, or conductive material surfaces that are regularly shaped (e.g., concave or convex spherical surfaces). For purpose of illustration, the following description will focus on the evaluation of conductive materials that are planar or can be formed or supported by a planar surface.

Apparatus 10 includes plate 12 presenting surface 120 that is highly electrically conductive. Plate 12 is provided with holes 122 and 124 which penetrate surface 120 and into, or typically pass through, plate 12. Plate 12 is rigid and surface 120 is a precisely flat surface of high conductivity comparable to that of silver or gold. While plate 12 could be solid silver or gold, the obvious expense associated with such an embodiment makes other options more typical. For example, plate 12 could be a piece of metal (e.g., aluminum) machined to have a flat surface that is accurate within a few mils. The flat surface could then be silver or gold plated to form conductive surface 120. If plate 12 is metallic, each of holes 122 and 124 essentially defines an electrically shielded cavity within plate 12. However, many other realizations of plate 12 are also possible. In another embodiment, plate 12 could be made from a non-conductive material, e.g., optical glass, that has a conductive material sputtered or painted thereon to form surface 120. Note that if plate 12 is made from a non-conductive material, walls 123 and 125 of respective holes 122 and 124 must be lined with metal to define electrically shielded cavities within plate 12. In all cases, plate 12 should be of sufficient thickness to insure extreme rigidity within the test environment, e.g., one-half inch thick aluminum is generally suitable for most applications.

Maintained within holes 122 and 124, but not touching respective walls 123 and 125, are respective coupling loops or coils 14 and 16 oriented to achieve maximum magnetic coupling to dielectric resonator 30 as will be explained further below. Each of coupling loops 14 and 16 can be constructed in any one of a variety of ways well known in the art. For example, loop 14 could be made from rigid coaxial cable as shown in FIG. 2 which is a view taken along line 2—2 of FIG. 1. Only loop 14 will be described in detail since loop 16 is identical to loop 14. Loop 14 is formed at the end of a conventional rigid coaxial cable 140 using a length of center conductor 142 that: 1) extends beyond the end of outer conductor 144 and dielectric material casing 146, and 2) is connected to outer conductor 144 at solder joint 148. Holes 122 and 124 are sized to form a snug (friction) fit with the coaxial cable to insure that microwave energy emanating from or received by the coupling loops only passes through the openings formed by holes 122 and 124 in surface 120.

Coupling loop 14 serves as an input port that is electrically connected to signal source 18. Signal source 18 is any source capable of generating microwave energy at a constant level at an operating frequency f. Coupling loop 16 serves as an output port that is electrically connected to measurement device 19, e.g., power-meter, spectrum analyzer, etc.

Spaced apart from plate 12 is plate 20 having precisely planar surface 22. In the illustrated example, surface 22 provides a planar support for a flexible electrically conductive material under test (MUT), e.g., a conductive mesh shown as dashed line 24, conforming to the flatness (or other shape) of planar surface 22 by any one of a variety of means. For example, the mesh sample can be tensioned in a frame (not shown) that is larger than plate 20 so that mesh 24 rests on plate 20. In this example, plate 20 is oriented as the lower plate of apparatus 10 in order to also allow gravity to operate on conductive mesh 24 to help mesh 24 maintain a planar configuration on planar surface 22. However, if the MUT is a rigid conducting material such that surface 22 of plate 20 is the MUT, the position of plates 12 and 20 is not critical in terms of which is the upper or lower plate of apparatus 10.

For reasons that will be explained further below, conductive mesh 24 is maintained in a parallel, spaced apart relationship with surface 120 of plate 12. Separation distance D between conductive mesh 24 and surface 120 must be less that $\lambda/2$ where $\lambda$ is the wavelength of the signal produced by signal source 18. Spacing between conductive mesh 24 (supported by plate 20) can be accomplished by the use of dielectric material spacers 26 placed at the edges of apparatus 10 between plate 20/conductive mesh 24 and plate 12. The loss tangent $\delta$ for spacers 26 is generally less than 0.001, although the loss tangent and relative dielectric constant $\epsilon_R$ of spacers 26 are not critical if spacers 26 are positioned beyond the active-field region of dielectric resonator 30, as will be explained further below. For adequate support, spacers 26 are typically a rigid dielectric material capable of supporting plate 12. Examples of commercially available materials suitable for spacers 26 include, but are not limited to, polystyrene to include cross-linked polystyrene which is available commercially under the tradename Rexolite as manufactured by C-Lec Plastics, Inc., and polytetrafluoroethylene which is available commercially under the tradename Teflon as manufactured by DuPont, Inc.

Ideally, dielectric resonator 30 is a block of dielectric resonator material that is extremely low-loss (e.g., loss tangent $\delta$ on the order of $10^{-5}$ or less) while possessing high-dielectric characteristics (e.g., relative dielectric constant $\epsilon_R$ on the order of 30 or greater). An example of such a dielectric resonator material available in cylindrical block form is D8515 from Trans-Tech, Inc. This particular dielectric resonator has a relative dielectric constant $\epsilon_R$ of 36, a resonant frequency of 4.3 GHz, a loss tangent $\delta$ of less than $10^{-5}$, and a temperature coefficient of frequency (defining the frequency stability of the material with respect to temperature) of nominally 0 parts per million per °C.

Dielectric resonator 30 is positioned between coupling loops 14 and 16, and closer to conductive mesh 24 (or planar surface 22 when the planar surface is also the conductive MUT) than to surface 120 of plate 12. Typically, the distance d between dielectric resonator 30 and conductive mesh 24 (or planar surface 22 when the planar surface is also the conductive MUT) is on the order of 50–200 mils. However, the distance d can be greater at the expense of lowered system sensitivity. Proper positioning of dielectric resonator 30 with respect to conductive mesh 24 can be accomplished using, for example, support post 32 made from a very low-loss, low-dielectric material. Since post 32 is in the active-field region of dielectric resonator 30, the loss tangent $\delta$ for post 32 should generally be less than 0.001 while simultaneously possessing a low relative dielectric constant $\epsilon_R$ generally in the range of 2.5 or lower. Suitable examples for post 32 include, but are not limited to, polystyrene and polytetrafluoroethylene. Bonding dielectric resonator 30 to post 32, and post 32 to surface 120, can be accomplished with a low-loss adhesive such as the commercially available "TransBond" manufactured by Trans-Tech, Inc.

Use of apparatus 10 in the determination of surface conductivity of conductive mesh 24, for example, will now be explained. In essence, conductive mesh 24 and surface 120 of plate 12 define a "cavity" therebetween in which the MUT, i.e., conductive mesh 24, is non-conductively joined to the rest of the "cavity". It is assumed that a fundamental relationship exists between the Q-factor of the cavity (ratio of peak energy stored to energy dissipated per cycle) and surface conductivity. Thus, surface conductivity of conductive mesh 24 can be determined by comparing: 1) the measured Q-factor of dielectric resonator 30 with conductive mesh 24 in place to 2) the measured Q-factor of dielectric resonator 30 when (electrically conductive) reference standards (not shown) having known surface conductivities are used in place of mesh 24. In particular, reference standards are chosen such that one (or more) reference standard has its surface conductivity greater than that expected of conductive mesh 24, and such that one (or more) reference standard has its surface conductivity less than that expected of conductive mesh 24 that the surface conductivity of conductive mesh 24. In this way, surface conductivity of mesh 24 can be interpolated based on the measured Q-factors. For best linear-interpolation accuracy, surface conductivities of the reference standards should closely bracket the expected surface conductivity of the material under test, i.e., conductive mesh 24. This is because the relationship between the surface conductivity of the mesh and the measured Q-factor is somewhat non-linear. Accordingly, the use of additional reference standards can better define the relationship between surface conductivity and measured Q-factors.

Apparatus 10 is designed to take advantage of the fact that the trapped state $TE_0$ resonant mode of a dielectric resonator located between finite parallel plates (e.g., conductive mesh 24 and surface 120 of plate 12) spaced less that $\lambda/2$ apart from one another does not radiate energy. If the parallel plates are of sufficient size, the non-propagating $TE_0$ field around dielectric resonator 30 decays radially and there is no energy loss through radiation even though the "cavity" between conductive mesh 24 and surface 120 is substantially open around its perimeter. In general, the parallel plates (e.g., conductive mesh 24 and surface 120) must be sized such that a distance $X \geq \lambda$ is maintained between each of coupling loops 14 and 16 and the closest edge of either conductive mesh 24 or surface 120. Placing spacers 26 beyond the above-defined distance X insures that they are beyond the active-field region of dielectric resonator 30. The finite conductivity of conductive mesh 24 and surface 120 introduces loss into the field around dielectric resonator 30.

The loaded Q-factor of dielectric resonator 30 includes intrinsic loss associated with the particular dielectric resonator material and losses coupled into dielectric resonator 30 from plate 12, conductive mesh 24 (or the reference standards used to replace conductive mesh 24) and coupling loops 14 and 16. Apparatus 10 maximizes its sensitivity to the loaded Q-factor, and thus surface conductivity, by locating dielectric resonator 30 closer to the material under test, i.e., conductive mesh 24 or one of the reference standards, than to surface 120.

Coupling loops 14 and 16 are positioned and rigidly maintained within holes 122 and 124 of plate 12 to establish magnetic coupling with dielectric resonator 30 with minimal disruption of the fields around dielectric resonator 30. For a cylindrically-shaped dielectric resonator 30, maximum magnetic coupling from each of coupling loops 14 and 16 to dielectric resonator 30 is achieved as described below with reference to FIG. 3. In FIG. 3, dielectric resonator 30 and holes 122 and 124 are shown in a plan view taken along line 3—3 of FIG. 1. Cylindrical dielectric resonator 30 is positioned midway between holes 122 and 124. More specifically, centers 122C and 124C of holes 122 and 124 are equidistant from and aligned with center 30C of dielectric resonator 30. Alignment of centers 30C, 122C and 124C is represented in FIG. 3 by line 31. For maximum magnetic coupling, the planes defined by coupling loops 14 and 16 are positioned perpendicular to line 31. Further, by electrically shielding each of coupling loops 14 and 16 within holes 122 and 124, coupling between loops 14 and 16 is negligible and the excitation of the undesirable TEM mode (which can propagate between and out of the conductive parallel plates) is not of discernible measure.

Although the present invention has been described relative to a particular embodiment, it is not so limited. For example, spacers 26 and support post 32 could be replaced with a low-loss (loss tangent$\leq 0.001$), low-dielectric (relative dielectric constant$\leq 1.1$) rigid polyurethane foam box 40 that completely encases and properly positions dielectric resonator 30 while also serving as a spacer between conductive mesh 24 and plate 12 as shown in FIG. 4. Typically, foam box 40 is formed from two halves 42 and 44 with respective recesses 43 and 45 that create pocket 46 to position dielectric resonator 30. Top half 42 also serves as the support for conductive mesh 24.

Figure 5:
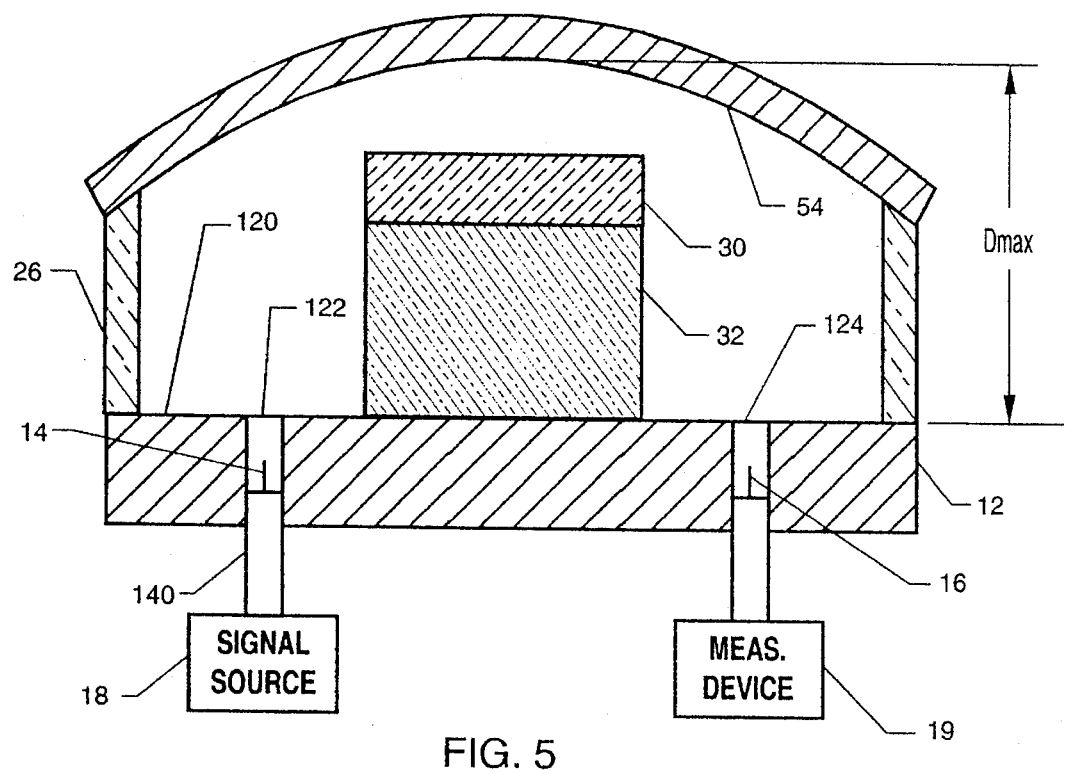
FIG. 5 is, in part, a schematic view and, in part, a side cross-sectional view of another embodiment in which the conductive surface under evaluation is curved.

As mentioned above, the apparatus of the present invention can also be used with regularly shaped conductive surfaces such as concave conductive surface 54 shown in FIG. 5 where like reference numerals have been used for those elements common with FIG. 1. In the embodiment of FIG. 5, conductive surface 54 is spaced from surface 120 so that the maximum distance $D_{MAX}$ between surface 120 and concave conductive surface 54 does not exceed $\lambda/2$. The shape of conductive surface 54 must be the same for the MUT and all reference standards.

It is to be understood that, within the scope of the appended claims, the invention may be practiced other than as specifically described. For example, instead of measuring Q-factors, insertion loss between coupling loops 14 and 16 could be measured using the same apparatus as described above.

What is claimed as new and desired to be secured by Letters Patent of the United States is:

1. An apparatus comprising:
   a first plate having an electrically conductive surface and having first and second holes passing through said electrically conductive surface into said first plate;
   a first coupling loop electrically shielded within said first hole;
   a second coupling loop electrically shielded within said second hole;
   means for supplying microwave energy at an operating frequency f to said first coupling loop;
   means for measuring microwave energy received at said second coupling loop;
   a second plate supporting an electrically conductive material under test (MUT);
   non-conductive spacer means for maintaining said electrically conductive surface of said first plate and said MUT in a spaced apart relationship;
   a dielectric resonator; and
   means for positioning said dielectric resonator between said first coupling loop and said second coupling loop, and for positioning said dielectric resonator closer to said MUT than said electrically conductive surface of said first plate.

2. An apparatus as in claim 1 wherein said spaced apart relationship is defined by a maximum separation distance between said electrically conductive surface of said first plate and said MUT, said maximum separation distance being less than $\lambda/2$ where $\lambda$ is the wavelength of said operating frequency f of said means for supplying microwave energy.

3. An apparatus as in claim 1 wherein a minimum distance is defined between each of said first coupling loop and said second coupling loop and a closest edge of either of said electrically conductive surface of said first plate or said MUT, said minimum distance being greater than or equal to $\lambda$ where $\lambda$ is the wavelength of said operating frequency f of said means for supplying microwave energy.

4. An apparatus as in claim 1 wherein said non-conductive spacer means is a dielectric material having a loss tangent less than or equal to 0.001.

5. An apparatus as in claim 1 wherein said means for positioning is a dielectric material having a loss tangent less than or equal to 0.001.

6. An apparatus as in claim 1 wherein said dielectric resonator has a relative dielectric constant greater than or equal to 30, and has a loss tangent less than or equal to $10^{-5}$.

7. An apparatus as in claim 1 wherein said dielectric resonator is separated from said electrically conductive surface by approximately 50–200 mils.

8. An apparatus comprising:
   a rigid plate having an electrically conductive planar surface and having first and second holes passing through said planar surface into said rigid plate;
   a first coupling loop electrically shielded within said first hole;

a second coupling loop electrically shielded within said second hole;

means for supplying microwave energy at an operating frequency f to said first coupling loop;

means for measuring microwave energy received at said second coupling loop;

an electrically conductive material under test (MUT) having a surface maintained in a planar configuration;

non-conductive spacer means for maintaining said planar surface and said surface of said MUT in a spaced apart parallel relationship;

a cylindrical dielectric resonator; and means for positioning said cylindrical dielectric resonator midway between said first coupling loop and said second coupling loop, and for positioning said dielectric resonator closer to said surface of said MUT than said planar surface.

9. An apparatus as in claim 8 wherein said spaced apart parallel relationship is defined by a separation distance between said planar surface and said surface of said MUT, said separation distance being less than $\lambda/2$ where $\lambda$ is the wavelength of said operating frequency f of said means for supplying microwave energy.

10. An apparatus as in claim 8 wherein a minimum distance is defined between each of said first coupling loop and said second coupling loop and a closest edge of either of said planar surface or said surface of said MUT, said minimum distance being greater than or equal to $\lambda$ where $\lambda$ is the wavelength of said operating frequency f of said means for supplying microwave energy.

11. An apparatus as in claim 8 wherein said non-conductive spacer means is a dielectric material having a loss tangent less than or equal to 0.001.

12. An apparatus as in claim 8 wherein said means for positioning is a dielectric material having a loss tangent less than or equal to 0.001.

13. An apparatus as in claim 8 wherein said cylindrical dielectric resonator has a relative dielectric constant greater than or equal to 30, and has a loss tangent less than or equal to $10^{-5}$.

14. An apparatus as in claim 8 wherein said cylindrical dielectric resonator is separated from said surface of said MUT by approximately 50–200 mils.

15. An apparatus as in claim 8 wherein said rigid plate is metal.

16. An apparatus as in claim 8 wherein said rigid plate is non-conductive and said planar surface is applied to said rigid plate.

* * * * *